United States Patent [19]

Morimoto et al.

[11] Patent Number: 4,935,092
[45] Date of Patent: Jun. 19, 1990

[54] METHOD OF GROWING $CaF_2$ FILM

[75] Inventors: Yoshihiro Morimoto, Kadoma; Kiyoshi Yoneda, Hirakata; Shoji Sudo, Nagaokakyo; Shoichiro Matsumoto, Hirakata, all of Japan

[73] Assignee: Sanyo Electric Co., Ltd., Osaka, Japan

[21] Appl. No.: 254,426

[22] Filed: Oct. 6, 1988

[30] Foreign Application Priority Data

Oct. 15, 1987 [JP] Japan ................................ 62-260257
Jul. 8, 1988 [JP] Japan ................................ 63-171685

[51] Int. Cl.$^5$ ............................................ C30B 25/10
[52] U.S. Cl. ..................................... 156/610; 156/612; 156/613; 156/614; 427/255.2; 423/490
[58] Field of Search ............... 156/603, 610, 612, 613, 156/614; 423/490; 427/255.1, 255.2

[56] References Cited

PUBLICATIONS

Asano et al., "Heteroepitatial Growth of Group IIa--Fluoride Films on Si Substrates", Japanese Journal of Applied Physics, vol. 22, No. 10, Oct. 83, 1474–1481.
Phillips et al., "Post Growth Annealing Treatments of Epitatial $CaF_2$ n Si (100)", Journal of Electrochem. Soc., vol. 133, No. 1, pp. 224–227.
Schowalter et al., "Molecular Beam Epitaxy Growth and Applications of Epitaxy Fluoride Films", Journal Vacuum Science Tech., A4(3) May/Jun. 1986, pp. 1026–1031.

Primary Examiner—John Doll
Assistant Examiner—M. Franklin
Attorney, Agent, or Firm—Darby & Darby

[57] ABSTRACT

The invention relates to a method of growing a single crystal $CaF_2$ film on a single crystal Si substrate having a principal plane of (100). According to the invention, the substrate temperature is first set at 550°–600° C. to grow a first $CaF_2$ film (first stage) and the substrate temperature is then raised to 750° C. or higher to grow a second $CaF_2$ film on the first $CaF_2$ film (second stage), thus the growth of the $CaF_2$ films is performed separately in two stages. Since, in the second stage, the growth of $CaF_2$ film is possible even at higher substrate temperature, the method of growing according to the invention makes it possible to grow a single crystal $CaF_2$ film with flat surface morphology and excellent crystal quality.

12 Claims, 24 Drawing Sheets (a)

(b)

(c)

METHOD OF GROWING CAF₂ FILM

BACKGROUND OF THE INVENTION

1. Field of the Invention

This invention relates to a method of growing a single crystal $CaF_2$ film on an Si sunstrate to form an SOI (Silicon on Insulator) structure using $CaF_2$ as an insulation layer.

2. Description of the Prior Art

An SOI structure comprising a single crystal insulation film formed on an Si substrate with a single crystal Si film formed thereon is known as being able to attain higher intergration, higher speed, and lower power consumption of a semiconductor integrated circuit.

$CaF_2$ has a cubic crystal structure with a lattice constant of 5.46 Å and a very good lattice mismatching ratio of 0.6% with Si. Thus, it permits growth of good single crystal $CaF_2$ on and Si substrate. This may be used as an insulation film in SOI structure. Since evaporation of $CaF_2$ in stoichiometric composition easily occurs under vacuum, the vacuum deposition method and the molecular beam epitaxial method are used for the growth of $CaF_2$.

The growth of $CaF_2(111)$ film on an $Si(111)$ substrate (single crystal Si substrate with (111) principal plane) is reported, for example, in Japanese Journal of Applied Physics Vol. 22, No. 10, Oct., 1983, pages 1474–1481. According to this report, a $CaF_2(111)$ film with farily flat surface morphology and good crystal quality grows on the Si(111) substrate at a substrate temperature of 600° C. or higher. In this case, small triangular cracks of 10 nm high may be produced, but its production may be controlled by the optimization of the growth condition. In the crystal quality estimation by electron diffraction, a Kikuchi Line is observed in RHEED (Reflection High Engery Electron Diffraction) image, indicating high-quality crystal quality.

Thus, films satisfactory in crystal quality and flatness have been obtained, but they have drawbacks in using as an insulation film for forming an SOI structure comprising $Si/CaF_2/Si$ structure as follows: A $CaF_2(111)$ film grown at a substrate temperature near 700° C. relatively has a chemical stability, but those grown at a substrate temperature lower than it are chemically unstable and easy to dissolve in an acid, alkali, or organic solvent, and are not adapted to the manufacturing process of a semiconductor device. In addition, since an Si(111) film grown on a $CaF_2(111)$ film has many dangling bonds on the (111) plane, when an oxidation film for MOS device is formed, the interface level density of $Si/SiO_2$ interface becomes too high to provide satisfactory characteristics of the MOS device.

In contrast, a $CaF_2(100)$ film grown on an Si (100) substrate is chemically stable regardless of the growth temperature, permitting easy manufacturing process of a semiconductor device, the interface level density of $Si/SiO_2$ interface is small, and is suitable to the manufacture of the MOS device.

However, the optimum substrate temperature range for the growth of $CaF_2$ (100) film on the Si (100) substrate is limited to 500–600° C., and it is known that the surface morphology of the growing film will become roughened having column structure. An improvement is desired.

FIG. 1 is an electromicrograph (SEM photograph) by a scanning electron microscope (SEM) showing surface conditions of a $CaF_2$ (100) film grown several hundreds nm on a Si (100) substrate at a substrate temperature of 550° C. It exhibits a roughened surface morphology of 20-30 nm square column structure as reported in the Journal of Vacuum Science Technology, pages 1026–1031, A4(3), May/Jun., 1986. It is a question to grow an Si (100) film on such a surface.

It is possible for improving the crystal quality and surface morphology to give rapid thermal annealing after the $CaF_2(100)$ film has been grown as indicated in the Jornal of Electrochemical Society, pages 224–227, Vol. 133, 1, Jan., 1986. This literature reports that any $CaF_2(100)$ film grown on an Si(100) substrate at any temperature of 300° C. of higher is improved in crystal quality by annealing in argon atmosphere at 1100° C. for 20 seconds, and the surface morphology is changed from rough surface to flat one as well.

The above annealing is effective to improve the crystal quality and surface morphology of the $CaF_2(100)$ film. However, as reported in the literature, there is a problem in the control of the conditions such as temperaturue, time, and atmospheric gas in the annealing treatment. In addition, on the surface of $CaF_2(100)$ film after annealing, ashler type cracks are apt to occur in the <110> direction. Such cracks not only deteriorate the quality of the Si film grown on the $CaF_2(100)$ film, but also deteriorate the breakdown field of the $CaF_2$ insulation film itself, leading to increased leak current and deteriorated insulation film characteristics.

SUMMARY OF THE INVENTION

This invention aims at solving above-mentioned problems, wherein a substrate temperature of a single crystal Si substrate is first set at 500°–600° C. to grow a first $CaF_2$ film and the substrate temperature is then set at 750° C. or higher to grow a second $CaF_2$ film on the first $CaF_2$ film.

Accordingly, it is a first object of the invention to provide a method of growing a $CaF_2$ film having flat surface morphology and excellent crystal quality on a single crystal Si substrate without causing cracks, A second object of the invention is to provide a method of growing c $CaF_2$ film upon which a high-quality epitaxial Si film can be formed, A third object of the invention is to provide a method of growing a $CaF_2$ film having excellant dielectric breakdown strength, A fourth object of the invention is to provide a method of growing a $CaF_2$ film which can increase the faltness of the surface porphology, crystal quality and dielectric breakdown strength of the grown $CaF_2$ film by making the film thickness of the first $CaF_2$ film 42 nm or more, A fifth object of the invention is to provide a method of growing a $CaF_2$ film which can increase the flatness of the surface morphology, crystal quality and dielectric breakdown strength of the grown $CaF_2$ film by making the total thickness of the first and second $CaF_2$ films 100 nm or more; and A sixth object of the invention is to provide a method of growing a $CaF_2$ film which can increase the flatness of the surface morphology, crystal quality and dielectric breakdown strength of the grown $CaF_2$ film by applying a heat treatment afer growing the first $CaF_2$ film.

The above and further objects and features of the invention will more fully be apparent from the following detailed description with accompanying drawings.

DESCRIPTION OF THE PREFERRED EMBODIMENTS

The present invention is now described in detail on the preferred embodiments.

Figure 1:
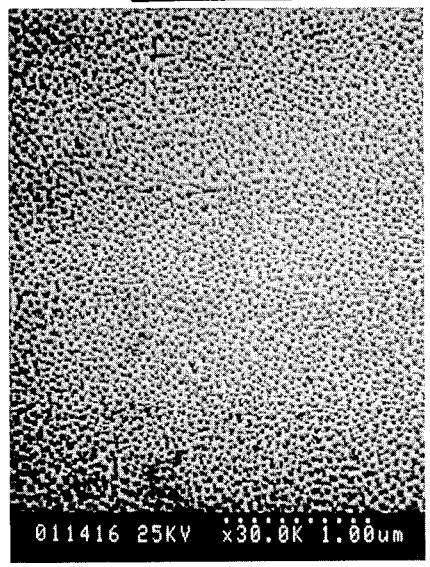
FIG. 1 is an SEM photograph showing the surface conditions of a CaF$_2$ film grown by a conventional method.
Figure 2:
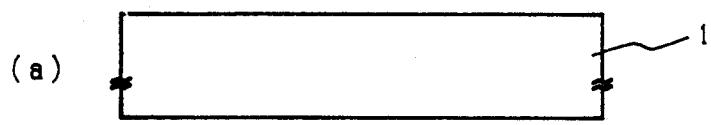
FIG. 2 is a, b and c is a type diagram showing the process of growing the CaF$_2$ film according to the invention.
Figure 2:
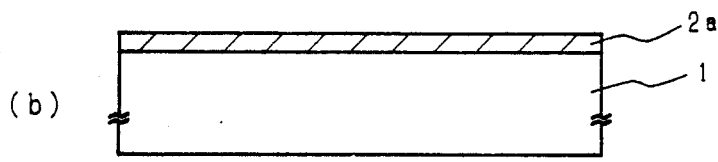
Figure 2:
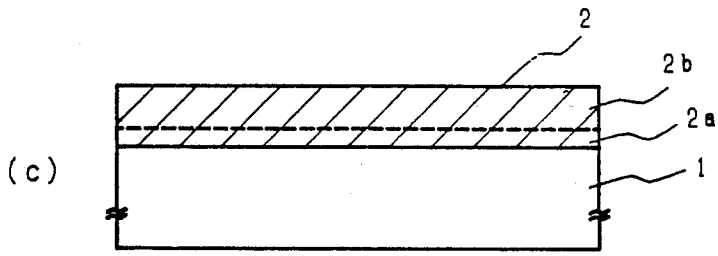

FIG. 2 (a)-(c) are process diagrams showing the method of growing the CaF$_2$ film according to the invention. A chemically washed Si(100) substrate 1 is set in the sample chamber of an MBE (Molecular Beam Epitaxial) growing equipment not shown, and after exhausting to a vacuum of $10^{-9}$ Torr, the Si substrate 1 is transferred to the growth chamber of the equipment kept in a vacuum of $10^{-11}$ Torr.

Then, the Si substrate 1 is heated to 850° C. and held at this temperture for about 20-30 minutes for thermal removal of the thin native oxide and contamination to expose the clean surface (FIG. 2(a)). Exposure of the clean surface is checked by an electron diffraction equipment provided on the MBE growing equipment.

After that, the temperature of the Si substrate 1 is lowered bout 550° C., and the Si substrate 1 is irradiated with CaF$_2$ molecular beam having an intensity in response to the temperature from a Knudsen cell filled with CaF$_2$ heated, in advance, to 1145°-1230° C., and the first stage growth (growth of the first CaF$_2$(100) film 2a) is started. The start and the end of the growth in this case are controlled by opening and closing a shutter provided in front of the Knudsen cell, and the growth rate is 0.2-1.0 μm/hr.

Figure 3:
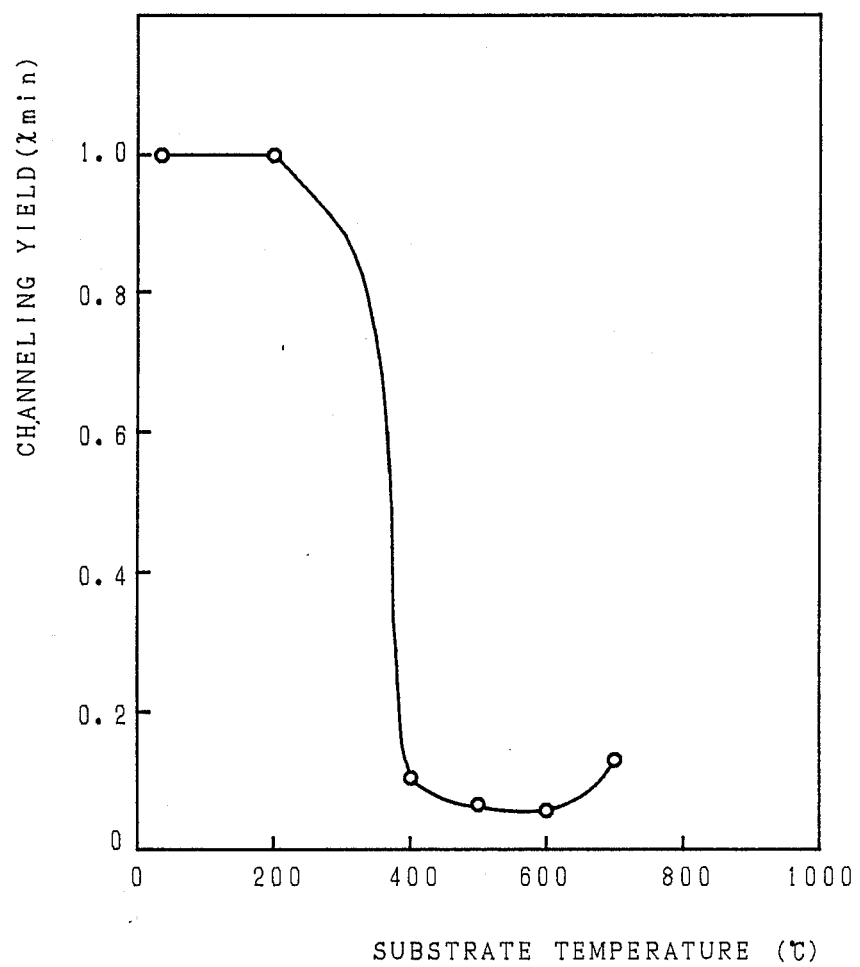
FIG. 3 is a graph showing the temperature dependence of the CaF$_2$(100) film growth on the Si(100) substrate.

FIG. 3 is a graph showing the temperature dependence of the CaF$_2$(100) film growth upon the temperature on the Si (100) substrate. It is shown from the value of the channeling yield that CaF$_2$(100) film having good crystal quality is grown on the Si(100) substrate only at a substrate temperature between 550°-600° C.

Figure 4:
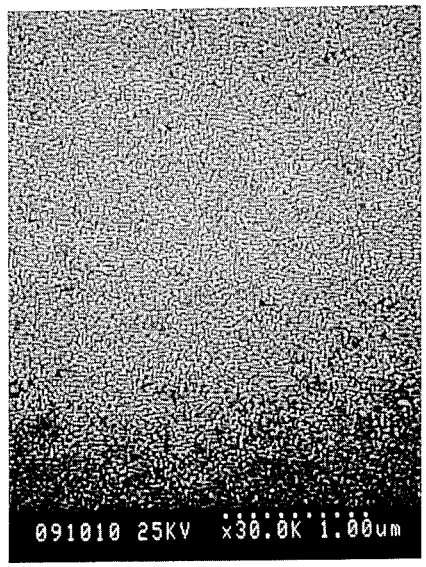
FIGS. 4, 5, 7, 9, 11, 12, 14, 16, 21, 23, 25, 27, 29, 31, 32, and 33 are SEM photographs showing the surface conditions of the CaF$_2$ film.
Figure 11:
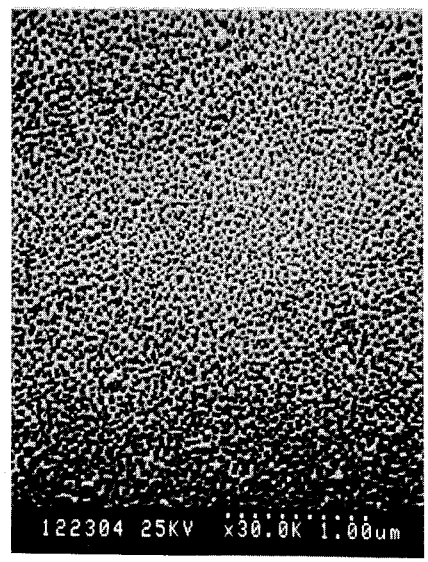

With the temperature set at 550° C., a thin CaF$_2$(100) film 2a of about 5-100 nm is grown on the Si substrate 1 (FIG. 2(b)). Its surface conditions are shown by SEM photographs in FIG. 4 and FIG. 11. FIG. 4 is the case when CaF$_2$ film 2a thickness is 5 nm, and FIG. 11 is the case when it is 70 nm.

Then, with the substrate temperature raised to about 750° C. or higher, second growth (a second CaF$_2$(100) film 2b growth) is made on the CaF$_2$ film 2a to form a CaF$_2$ film 2 (FIG. 2(c)). Here, since the CaF$_2$ film 2b is grown on the CaF$_2$ film 2a, not on the Si substrate 1, good growth is possible even not at a substrate temperture in a range of 550°-600° C.

Figure 5:
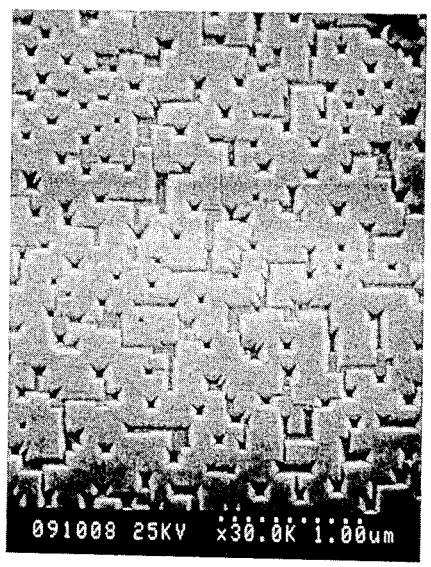
Figure 6:
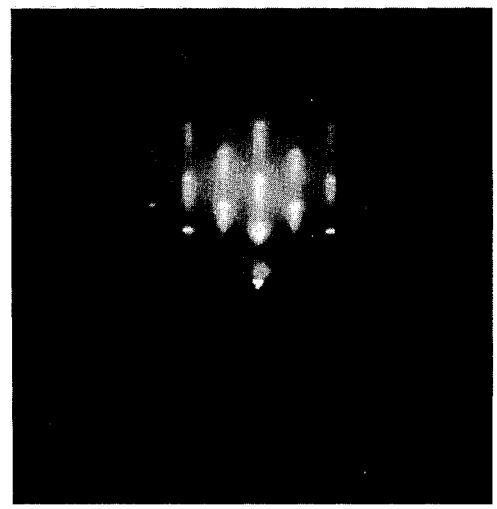
FIGS. 6, 8, 10, 13, 15, 17, 20, 22, 24, 26, 28, and 30 are RHEED image photographs showing the surface crystalline structures of the CaF$_2$ films.
Figure 7:
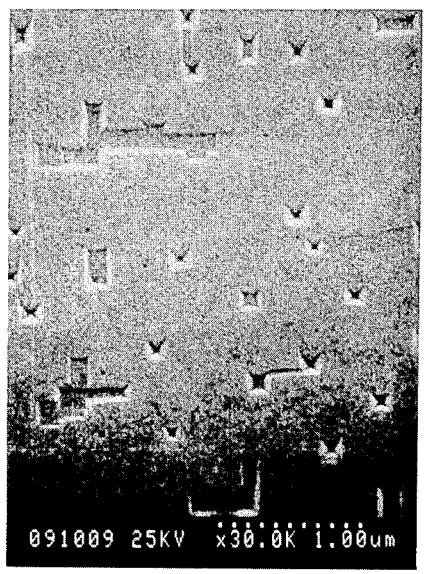
Figure 8:
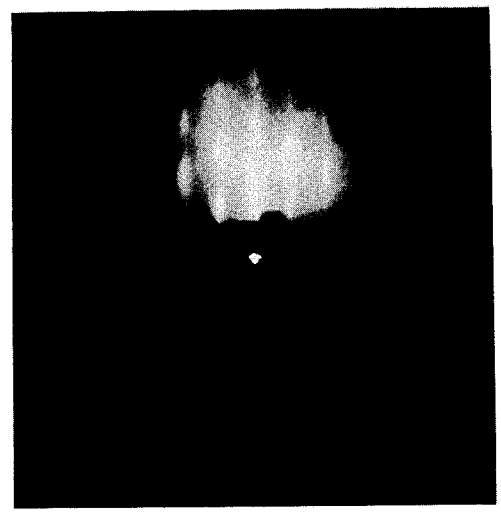
Figure 9:
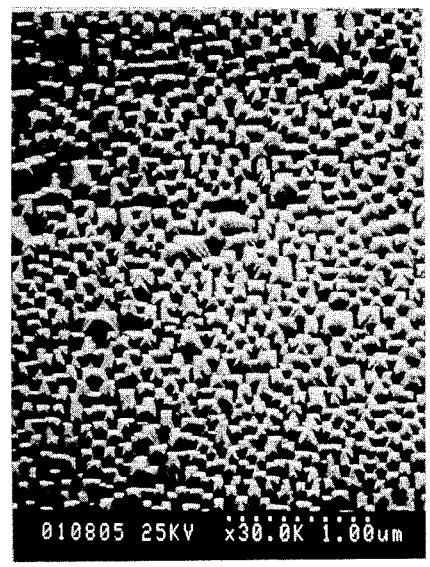
Figure 10:
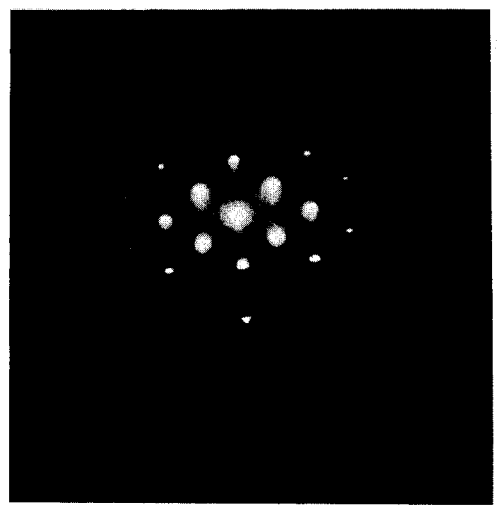
Figure 12:
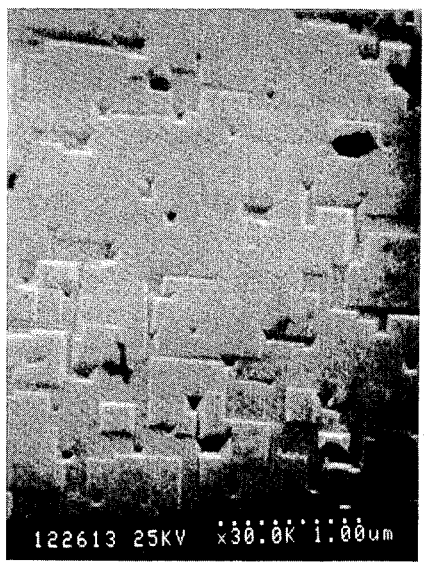
Figure 13:
Figure 14:
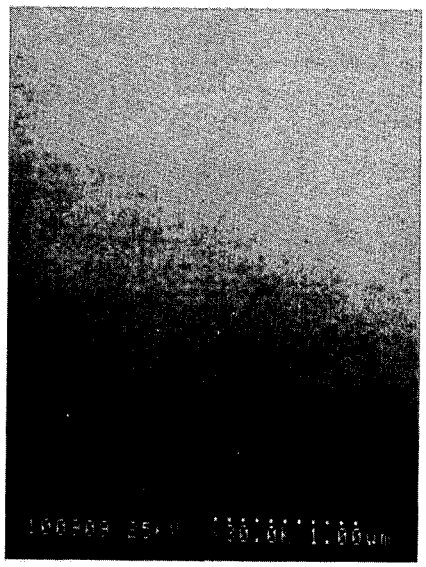
Figure 15:
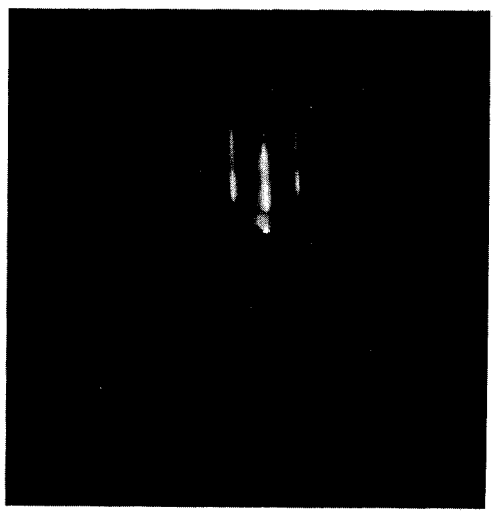
Figure 16:
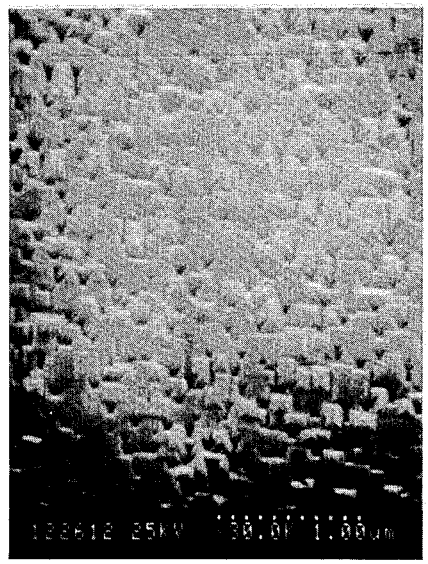
Figure 17:
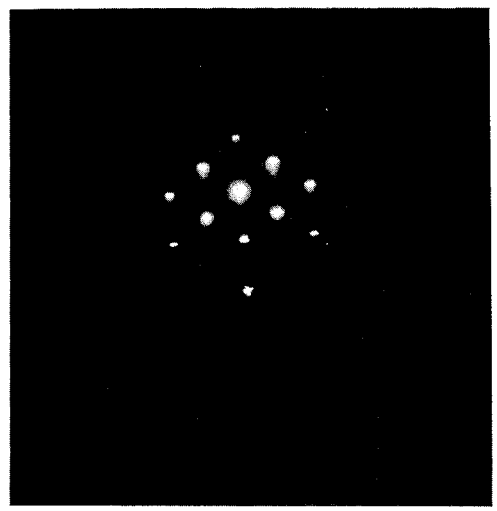

SEM photographs of the surface conditions of a CaF$_2$ film 2 grown to 500 nm at a substrate temperature of 750° C. in the second stage growth are shown in FIG. 5 and FIG. 12, and RHEED images of the surface crystal structure of the CaF$_2$ film are shown in FIG. 6 and FIG. 13. SEM photographs and RHEED images of the CaF$_2$ film 2 similarly grown to 500 nm at a substrate temperature of 800° C. are shown in FIG. 7, FIG. 14, and FIG. 8, FIG. 15, respectively, and SEM photographs and RHEED images of the CaF$_2$ film 2 grown to 500 nm at a substrate temperature of 700° C. are shown in FIG. 9, FIG. 16, and FIG. 10, FIG. 17, respectively. Those shown in FIGS. 5, 6, 7, 8, 9, and 10 have a thickness of the CaF$_2$ film 2a of 5 nm, and those shown in FIGS. 12, 13, 14, 15, 16, and 17 have a thickness of the CaF$_2$ film 2a of 70 nm, respectively.

As understood from these Figures, when the substrate temperature is 700° C., the substrate shows pyramidal coarse morphology and poor crystal quality. On the other hand, grown at the substrate temperature of 750° C., substantially flat surface morphology is shown and good crystal quality with a Kikuchi line observed. Further, at the substrate temperature of 800° C., very flat surface morphology and good crystal quality are shown. On the other hand, when the thickness of the CaF$_2$ film 2a grown initially is 70 nm, both the surface morphology and the crystal quality is better than those when the thickness of the CaF$_2$ 2a is 5 nm at the same substrate temperature.

Figure 18:
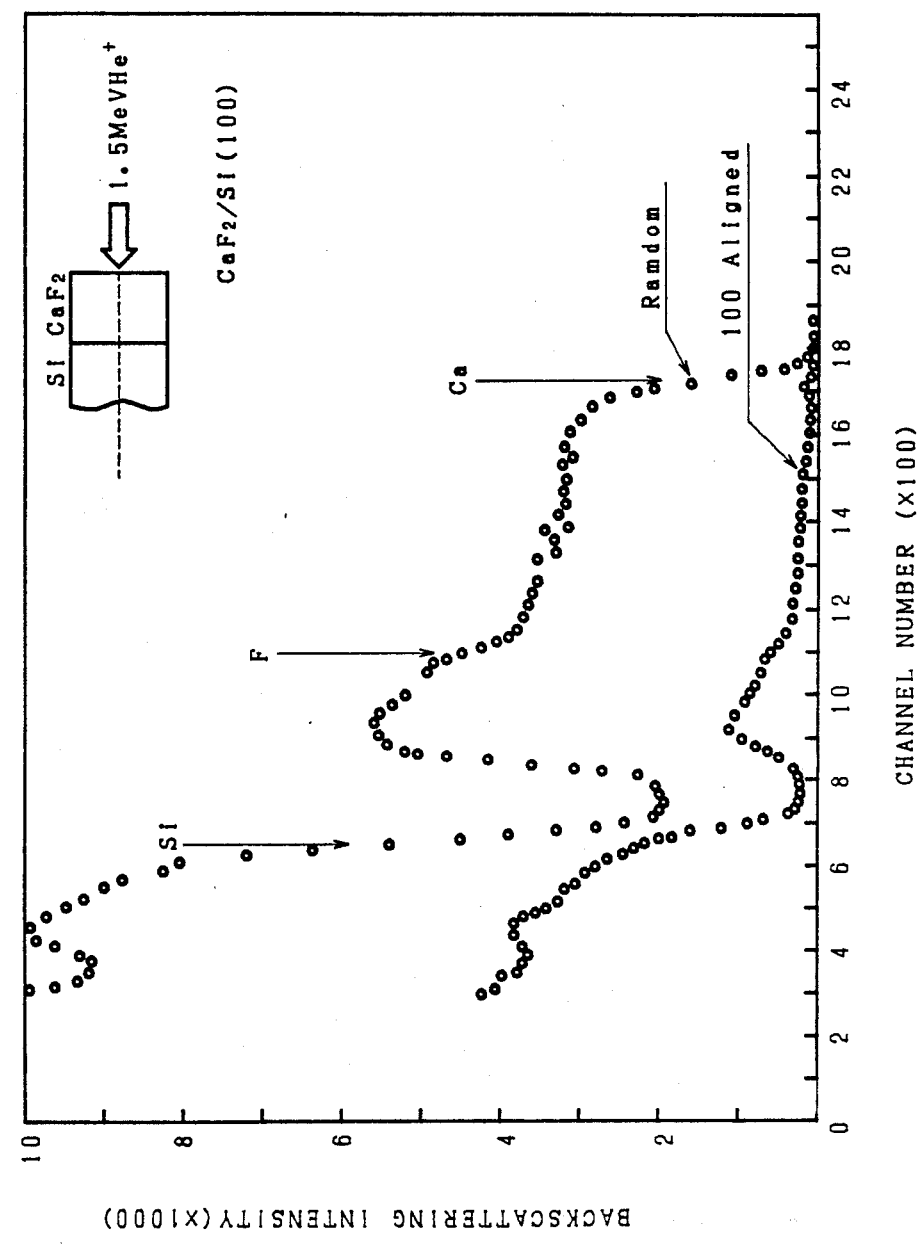
FIG. 18 is a graph showing the backscattering spectrum of the CaF$_2$ film.

The aspect of backscattering spectrum by HE ion of the CaF$_2$ film 2 grown on the Si substrate 1 at a substrate temperature of 800° C. is shown in fig. 18. The results of the backscattering spectrum indicate that the minimum yield (channeling yield:$x_{min}$) along the <100> axis is about 4%, showing good crystal quality.

The upper limit of the substrate temperature raised when the CaF$_2$ film 2b is grown after the CaF$_2$ film 2a has been grown at a substrate temperature from about 550° to 600° C. is about 900° C. If the temperature is higher than this, Ca or F atoms re-evaporate from the CaF$_2$ film grown on the substrate, hindering further growth of the CaF$_2$ film.

Then, the second embodiment of the method of growing CaF$_2$ film according to the invention is described.

In this embodiment, after the first CaF$_2$ film 2a has been grown, the substrate is subjected to heat treatment at a temperature of 800° C . or higher (annealing), and then the second CaF$_2$ film 2b is grown. The procedure of the pretreatmment of the Si substrate, the growth of CaF$_2$ film 2a in the first stage, and the growth of the CaF$_2$ film 2b in the second stage, are the same as decribed in the foregoing embodiment, and detailed description is ommited.

Figure 19:
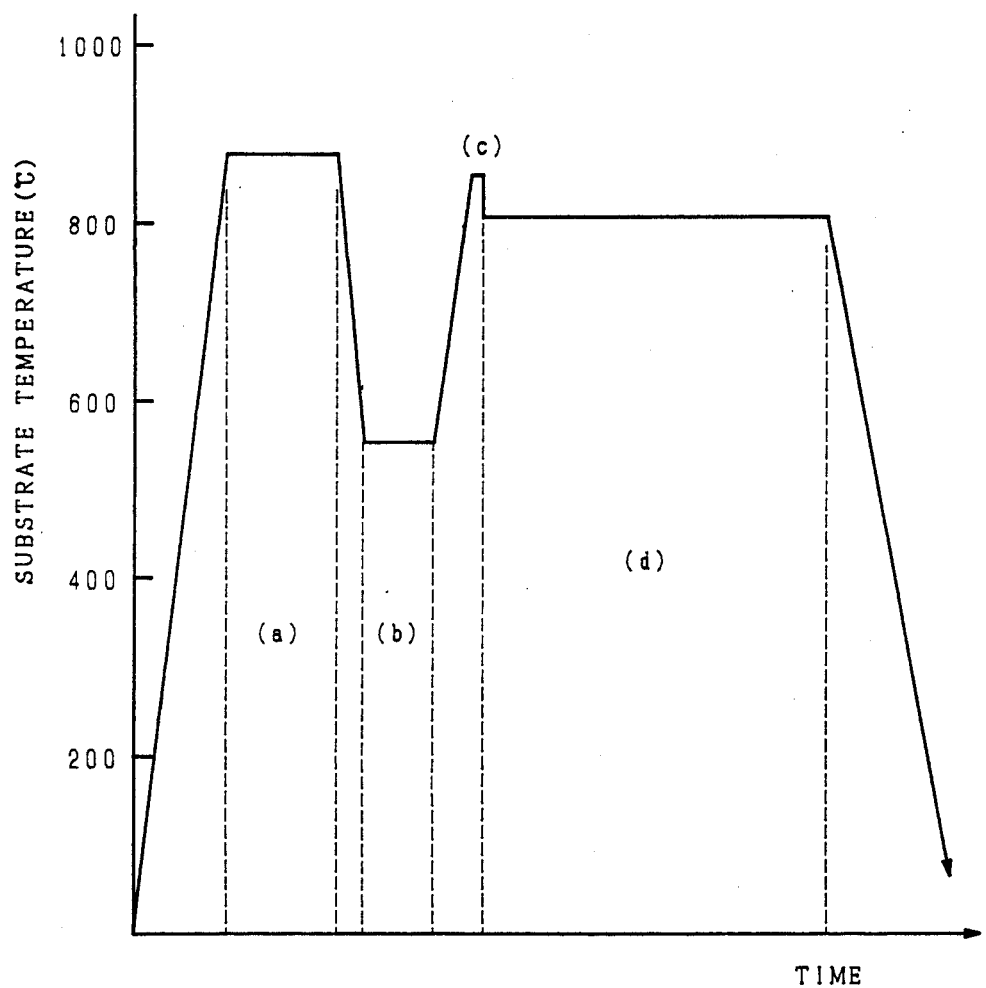
FIG. 19 is a type diagram showing the growth temperature profile in the second embodiment of the invention.

FIG. 19 is a profile of the growing temperature of the second embodiment. In FIG. 19, (a) represents a stage of holding Si substrate 1 at a temperature in the range of 850°–900° C. for about 20–30 minutes to clean the surface of the Si substrate 1, (b) represents a stage of growing a thin CaF₂ film 2a on the Si substrate 1 (the first stage of CaF₂ film growing), (c) represents a stage of applying heat treatment of the Si substrate 1, and (d) represents a stage of growing a CaF₂ film 2b on the CaF₂ film 2a (second stage of CaF₂ film growing).

In the second embodiment, after the CaF₂ film 2a has been growing in the first stage, the substrate temperature is raised to 850° C. and held at that temperature for 3 minutes or more to apply heat treatment, and after this, the CaF₂ film 2b is grown in the second stage.

Figure 20:
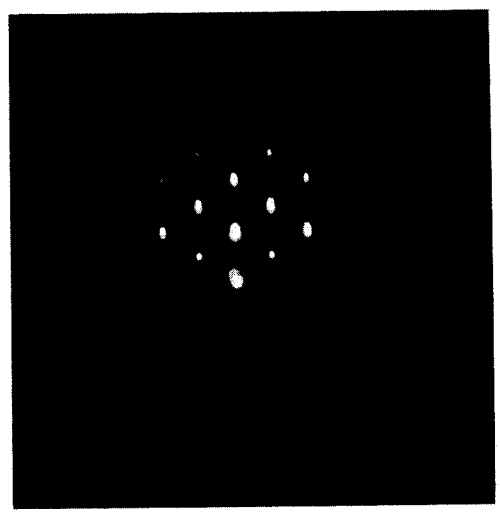
Figure 21:
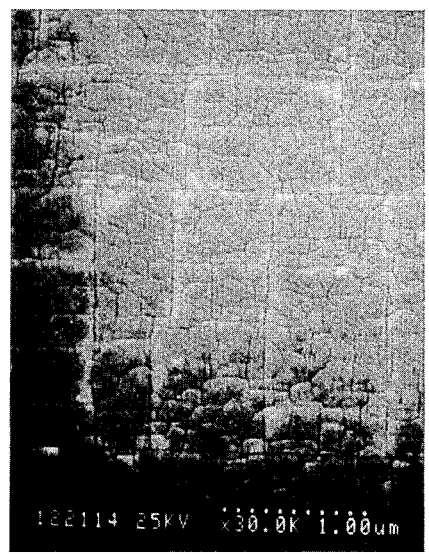
Figure 22:
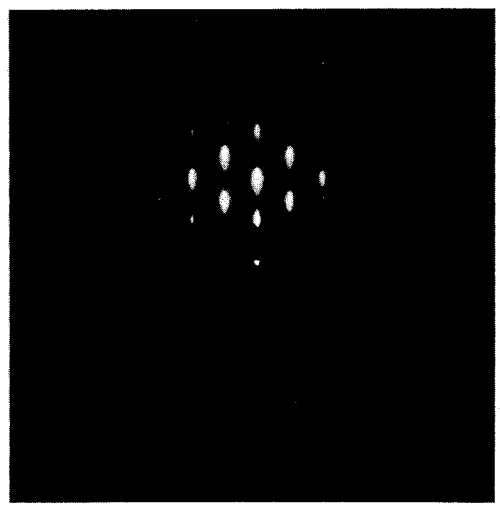
Figure 23:
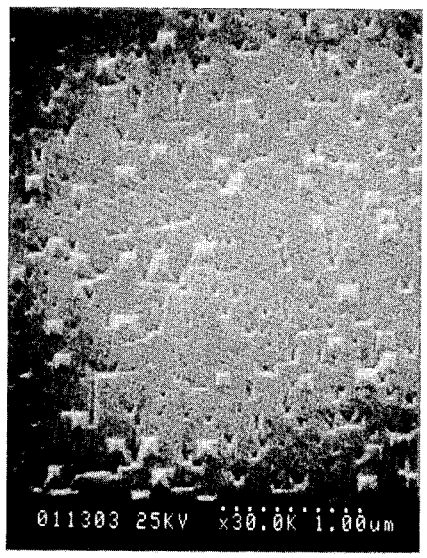
Figure 24:
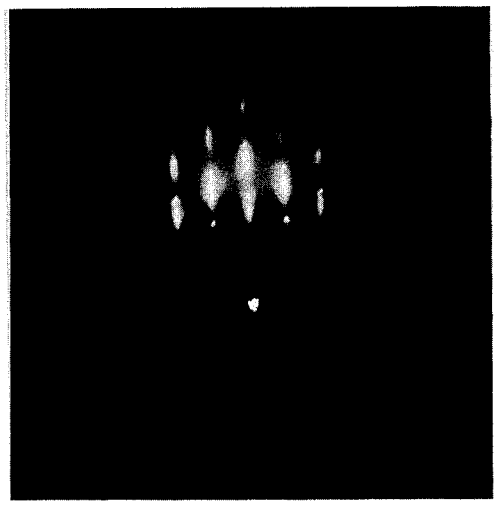
Figure 25:
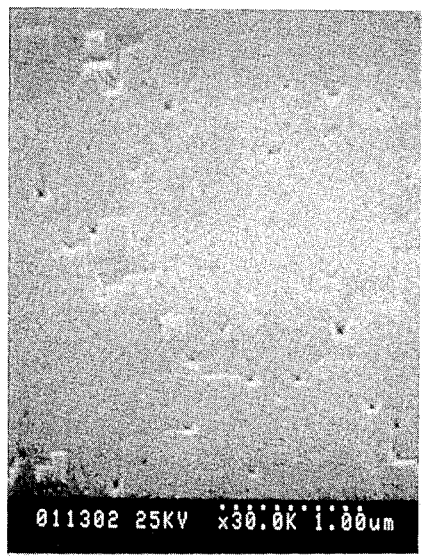
Figure 26:
Figure 27:
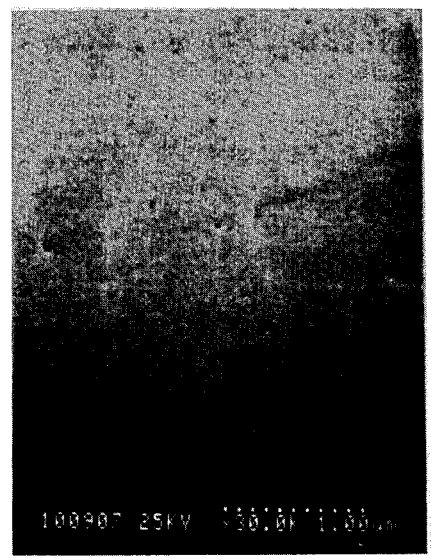
Figure 28:
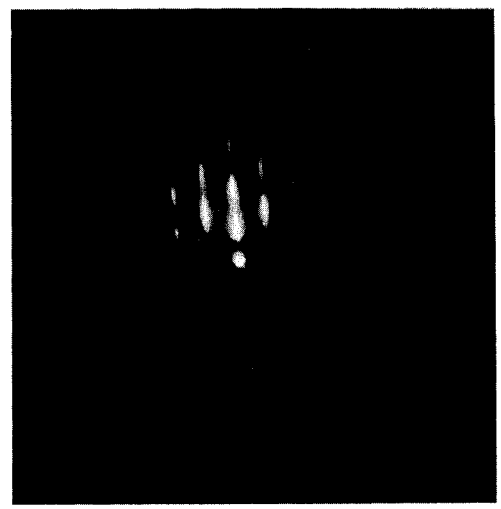
Figure 29:
Figure 30:
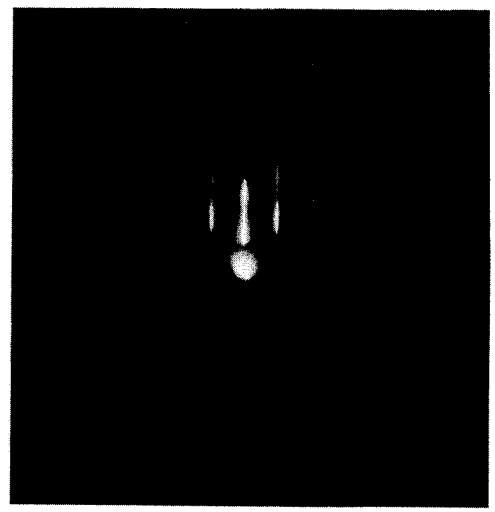

FIG. 20 shows the RHEED image after the CaF₂ film 2a has been grown to 70 nm in this embodiment. The SEM photograph here is the same as that in FIG. 11. FIGS. 21 and 22 show the SEM photograph and RHEED image, respectively, after the heat treatment in this embodiment. FIGS. 23–30 show the SEM hotographs and RHEED images when the CaF₂ film 2b is grown on the CaF₂ film 2a to the total film thickness of 800 nm at a substrate temperature of 700°, 750°, 800°, or 850° C. after the CaF₂ film 2a has been grown to 70 nm and the above heat treatment is applied in this embodiment. FIGS. 23 and 24 represents the case when the substrate temperature is 700° C., FIGS. 25 and 26, the case of the substrate temperature of 750° C., FIGS. 27 and 28, the substrate temperature of 800° C., and FIGS. 29 and 30, the substrate temperature of 850° C., respectively.

FIG. 21 shows that the heat temperature eliminates the pyramidal, abnormal growth (see FIG. 11) observed after the first stage growth into flat plane. FIGS. 23–30 shows that increased temperature in the second stage growth eliminates the surface irregularity of the CaF₂ film giving very smooth conditions and good crystal quality.

Figure 31:
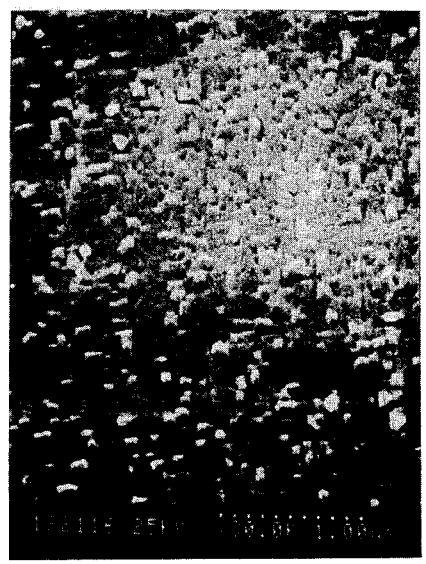
Figure 32:
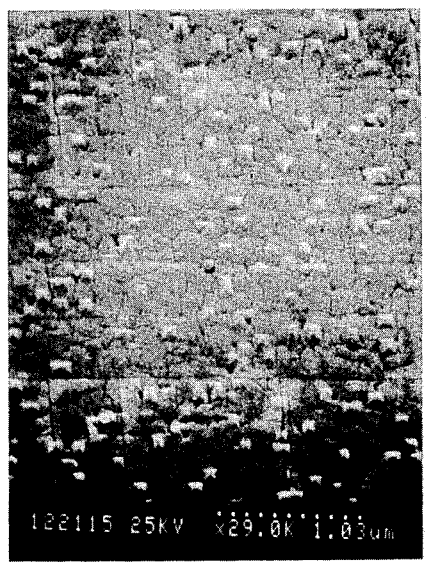
Figure 33:

FIGS. 31, 32, and 33 are the SEM photographs of the CaF₂ film grown when the heat treatment (treating time 5 min) temperature is set at 700°, 750° or 800° C. It is understood that when the heat treatment temperature is set at 800° C., the surface morphology is smoothed out. It is preferable to set the heat treatment at 800° C. or higher.

Then, the dielectric breakdown strength of the CaF₂ film grown by the second embodiment is described for the purpose of using it as an insulation film of an SOI structure.

Figure 34:
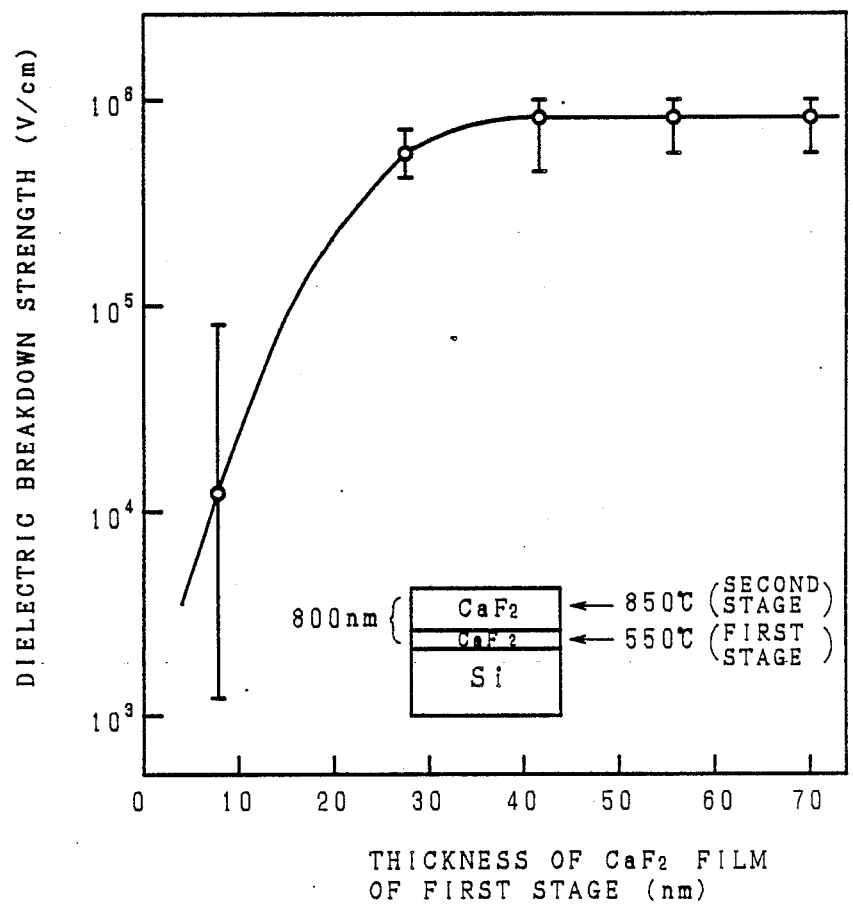
FIG. 34 is a graph showing the film-thickness dependence of the dielectric breakdown strength of the first CaF$_2$ film.

FIG. 34 is a graph showing the dependence of the dielectric breakdown strength upon the thickness of the CaF₂ film 2a in the first stage growth. Here, the substrate temperature in the second stage growth is 850° C. and the total thickness of the CaF₂ film is 800 nm. The dielectric breakdown strength is smaller and its dispersion is larger as the thickness of the first stage growth CaF₂ film is smaller. The dielectric breakdown strength is saturated when the thickness of the CaF₂ film 2a is 42 nm or more. Thus, it is satisfactory if the thickness of the CaF₂ film 2a is 42 nm or more in the first stage growth.

Figure 35:
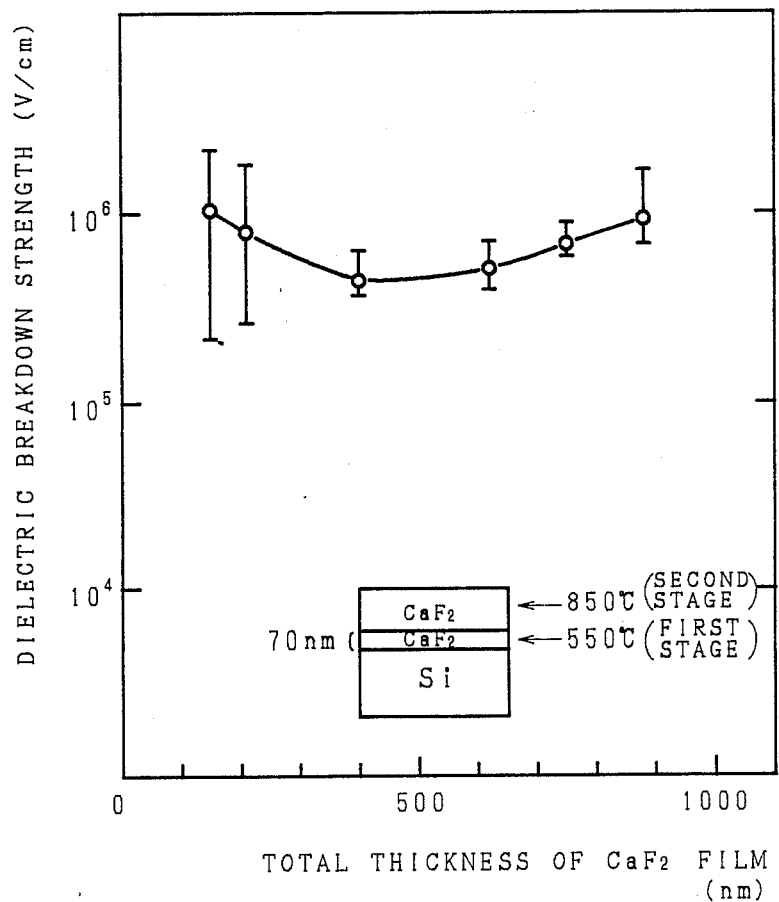
FIG. 35 is a graph showing the dependence of the dielectric breakdown strength on the total thickness of the first and second CaF$_2$ films.

FIG. 35 is a graph showing the dependence of the dielectric breakdown strength upon the total thickness of the CaF₂ film 2. Here, the thickness of the CaF₂ film 2a in the first stage growth is 70 nm and the substrate temperature in the second stage growth is 850° C. It is obvious from this graph that it is satisfactory if the total thickness of the CaF₂ film 2 is 100 nm or more.

Figure 36:
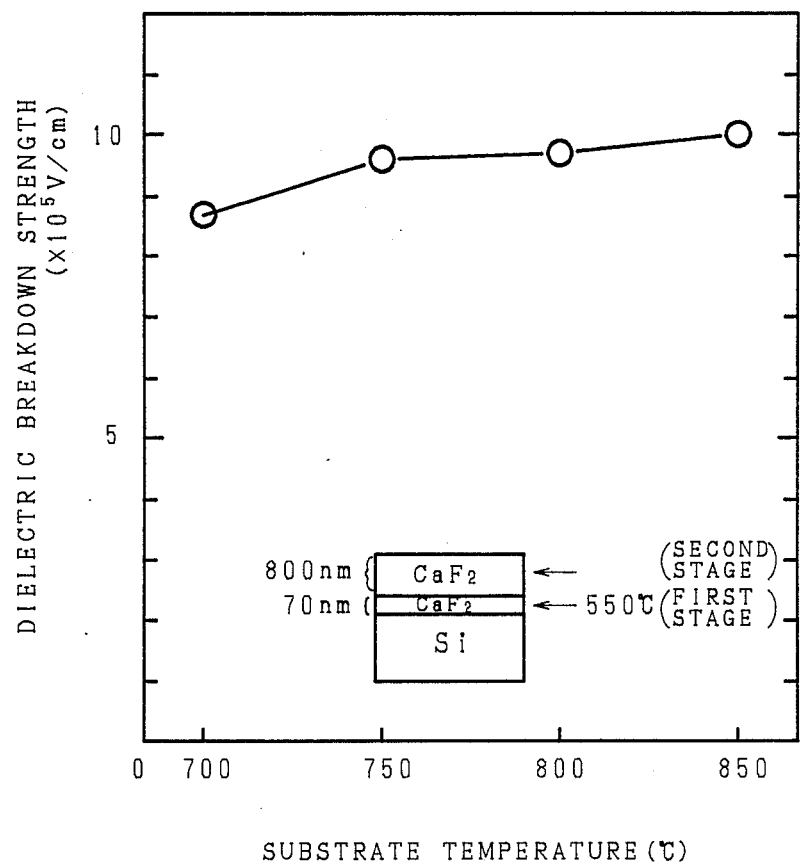
FIG. 36 is a graph showing the substrate temperature dependence of the dielectric breakdown strength when the second CaF$_2$ film grows.

FIG. 36 is a graph showing the dependence of the dielectric breakdown strength upon the substrate temperature in the second stage growth. Here, the thickness of the CaF₂ film 2a in the first stage growth is 70 nm and the total thickness of the CaF₂ film 2 is 870 nm. The dielectric breakdown strength increases as the substrate temperature increases, and it is understood to be satisfactory if the substrate temperature is 750° C. or higher.

It is obvious from these facts that to obtain a high dielectric breakdown strength, the thickness of the CaF₂ film 2a in the first stage growth is to be 42 nm or more, the total thickness of the CaF₂ film 2 is to be 100 nm or more, and the substrate temperature in the second stage growth is to be 750° C. or higher.

As detaileds above, the method according to the invention makes it possible to grow a CaF₂ film having a flat surface., good crystal quality and excellent dielectric breakdown strength on an Si substrate. As a result, an epitaxial growth of Si given on the CaF₂ film growth according to the method of the invention makes it possible to obtain a high-quality epitaxial film, and thus, provides an SOI structure which can form elements of excellent characteristics.

As this invention may be embodied in several forms without departing from the spirit of essential characteristic thereof, the present embodiment is therefore illustrative and not restrictive, since the scope of the invention is defined by the appended claims rather than by the description preceeding them, and all changes that fall within the meets and bounds of the claims, or equivalence of such meets and bounds thereof are therefore intended to be embraced by the claims.

What is claimed is:

1. A method of growing a CaF₂ film comprising; growing on a single crystal Si substrate with a principle plane of (100) a first single crystal CaF₂ film at the substrate temperature of about 550° to 600° C. and growing on the first single crystal CaF₂ film a second single crystal CaF₂ film at the substrate temperature of about 750° C. of higher.

2. A method of growing a CaF₂ film as claimed in claim 1, wherein the thickness of said first single crystal CaF₂ film is 42 nm or more.

3. A method of growing a CaF₂ film as claimed in claim 1, wherein the total thickness of said first and second single crystal CaF₂ films is 100 nm or more.

4. A method of growing a CaF₂ film as claimed in claim 1, wherein the thickness of said first single crystal CaF₂ film is 42 nm or more and the total thickness of said first second single crystal CaF₂ films is 100 nm or more.

5. A method of grwoing a CaF₂ film as claimed in claim 1, wherein the substrate temperature when growing said second single crystal CaF₂ film is 800° C. or higher.

6. A method of growing a CaF₂ film comprising; growing on a single crystal Si substrate with a principle plane of (100) a first single crystal CaF₂ film at the substrate temperature of about 550° to 600° C., applying a heat treatment to the substrate with said first single crystal CaF₂ film grown thereon, and growing on said first single crystal CaF₂ film a second single crystal CaF₂ film at the substrate temperature of about 750° C. or higher.

7. A method of growing a CaF₂ film as claimed in claim 6, wherein the thickness of said first single crystal CaF₂ film is 42 nm or more.

8. A method of growing CaF₂ film as claimed in claim 6, wherein the total thickness of said first and second single crystal CaF₂ films is 100 or more.

9. A method of growing a CaF$_2$ film as claimed in claim 6, wherein the thickness of said first single crystal CaF$_2$ film is 42 nm or more and the total thickness of said first and second single crystal CaF$_2$ films is 100 nm or more.

10. A method of growing a CaF$_2$ film as claimed in claim 6, wherein the substrate temperature when growing said second single crystal CaF$_2$ film is 800° C. of higher.

11. A method of growing a CaF$_2$ film as claimed in claim 6, wherein the temperature of said heat treatment is 800° C. or higher.

12. A method of growing a CaF$_2$ film as claimed in claim 11, wherein the temperature of said heat treatment is 850° C. or higher.

* * * * *